(12) United States Patent
Park et al.

(10) Patent No.: US 10,043,869 B2
(45) Date of Patent: Aug. 7, 2018

(54) METHOD OF PREPARING GRAPHENE-BASED THIN-FILM LAMINATE AND GRAPHENE-BASED THIN-FILM LAMINATE PREPARED USING THE SAME

(71) Applicant: Hanwha Techwin Co., Ltd., Changwon-si (KR)

(72) Inventors: ChongHan Park, Changwon-si (KR); SeungMin Cho, Changwon-si (KR); SunAe Seo, Seoul (KR); SoMyeong Shin, Seoul (KR); TaeKwang Kim, Seoul (KR); SeonYeong Kim, Seoul (KR)

(73) Assignee: Hanwha Techwin Co., Ltd., Changwon-si (KR)

( * ) Notice: Subject to any disclaimer, the term of this patent is extended or adjusted under 35 U.S.C. 154(b) by 0 days.

(21) Appl. No.: 15/048,182

(22) Filed: Feb. 19, 2016

(65) Prior Publication Data

US 2017/0221997 A1 Aug. 3, 2017

(30) Foreign Application Priority Data

Feb. 2, 2016 (KR) ........................ 10-2016-0012912

(51) Int. Cl.
*H01L 29/16* (2006.01)
*H01L 51/52* (2006.01)
(Continued)

(52) U.S. Cl.
CPC ...... *H01L 29/1606* (2013.01); *H01L 21/0259* (2013.01); *H01L 21/02488* (2013.01); *H01L 21/02491* (2013.01); *H01L 21/02527* (2013.01); *H01L 29/42356* (2013.01); *H01L 29/78684* (2013.01); *H01L 51/0021* (2013.01); *H01L 51/5206* (2013.01); *H01L 51/5221* (2013.01); *H01L 51/56* (2013.01); *H01L 2251/301* (2013.01); *H01L 2251/305* (2013.01); *H01L 2251/306* (2013.01); *H01L 2251/308* (2013.01)

(58) Field of Classification Search
None
See application file for complete search history.

(56) References Cited

U.S. PATENT DOCUMENTS

2014/0048799 A1* 2/2014 Tour .................... H01L 27/2463
257/43
2016/0194205 A1* 7/2016 Varshney .......... H01L 21/02425
427/314

FOREIGN PATENT DOCUMENTS

KR 10-2015-0115176 A 10/2015

OTHER PUBLICATIONS

Park et al, Growth and optical characteristics of high-quality ZnO thin films on graphene layers, 2015, APL Materials, pp. 016103-1-016103-6.*

(Continued)

*Primary Examiner* — Julio J Maldonado
*Assistant Examiner* — Valerie N Newton
(74) *Attorney, Agent, or Firm* — Sughrue Mion, PLLC (57) ABSTRACT

Provided are a method of preparing a graphene-based thin-film laminate and the graphene-based thin-film laminate prepared by using the method. The method may include repeating following operations 60 times or less, the cycle including: (a) to (d) processes described above, a graphene-based thin-film laminate prepared using the same, and an electrode and electronic device including the graphene-based thin-film laminate.

8 Claims, 6 Drawing Sheets

(51) Int. Cl.
| | |
|---|---|
| *H01L 29/786* | (2006.01) |
| *H01L 29/423* | (2006.01) |
| *H01L 51/56* | (2006.01) |
| *H01L 51/00* | (2006.01) |
| *H01L 21/02* | (2006.01) |

(56) References Cited

OTHER PUBLICATIONS

Guo et al, Structure evolution of Zn cluster on graphene for ZnO nanstructres growth, Jan. 20, 2011, Applied Physics, 109, pp. 024307-1-024307-4.*

Hou et al, Electrical and optical properties of Al-doped ZnO and ZnAl2O4 films prepared by atomic layer deposition, Mar. 28, 2013, Nanoscale Research Letters, 8:144.*

Mingpeng Yu, et al; "An alumina stabilized ZnO-graphene anode for lithium ion batteries via atomic layer deposition"; Nanoscale; 2014; vol. 6; pp. 11419-11424.

Woo Hyun Nam, et al; "Structurally Nanocrystalline-Electrically Single Crystalline ZnO-Reduced Graphene Oxide Composites"; NANO Letters; 2014; vol. 14; pp. 5104-5109.

* cited by examiner

METHOD OF PREPARING GRAPHENE-BASED THIN-FILM LAMINATE AND GRAPHENE-BASED THIN-FILM LAMINATE PREPARED USING THE SAME

CROSS-REFERENCE TO THE RELATED APPLICATION

This application claims priority from Korean Patent Application No. 10-2016-0012912, filed on Feb. 2, 2016, in the Korean Intellectual Property Office, the disclosure of which is incorporated herein in its entirety by reference.

BACKGROUND

1. Field

Apparatuses and methods consistent with exemplary embodiments relate to methods of preparing a graphene-based thin-film laminate and graphene-based thin-film laminates prepared using the same.

2. Description of the Related Art

Graphene is a two-dimensional hexagonal structure made of carbon atoms having a spacing of about 1.42 Å. Graphene has excellent properties in terms of strength, thermal conductivity, electron mobility, and the like, and thus, may be applied to transparent electrodes or graphene-based electronic devices.

In general, graphene may be prepared by mechanical exfoliation, chemical vapor deposition (CVD), epitaxial growth, chemical exfoliation, or the like. Graphene prepared using such a method has a sheet resistance of thousands of $\Omega/sq$, and thus, attempts to reduce the sheet resistance have been actively conducted to obtain suitable graphene for use in the industrial system.

To reduce the sheet resistance, a method of stacking multiple graphene layers is used. However, when this method is used, the number of manufacturing processes increases, and thus, raw material costs increase or defective rates increase during repeated manufacturing processes. Thus, development towards increasing a charge mobility or charge density of a graphene monolayer has been underway.

Therefore, there is still a need to develop a method of preparing a novel graphene structure and a graphene structure prepared using the same to enhance the charge mobility and to reduce sheet resistance of graphene.

SUMMARY

Exemplary embodiments provide methods of preparing a graphene-based thin-film laminate that may improve a charge mobility (particularly, electron mobility) and reduce an average sheet resistance. The exemplary embodiments also provide graphene-based thin-film laminates prepared using the same.

Various aspects of exemplary embodiments will be set forth in part in the description which follows and, in part, will be apparent from the description, or may be learned by practice of the presented embodiments.

According to an aspect of an exemplary embodiment, there is provided a method of preparing a graphene-based thin-film laminate. The method may include repeating a cycle of operations N times, which may include: (a) contacting a surface of graphene transferred onto a substrate at room temperature with a non-metal precursor gas and activating the surface of graphene with plasma at the same time; (b) performing a first purging on the resulting surface of graphene using an inert gas; (c) contacting the purged surface of graphene with a metal precursor gas; and (d) performing a second purging on the resulting surface of graphene using an inert gas, wherein the N times are 60 times or less.

According to another aspect of an exemplary embodiment, there is provided a graphene-based thin-film laminate which may be prepared using the method described above. The graphene-based thin-film laminate may include: a substrate; graphene formed on the substrate; and Al-doped ZnO (AZO) film which is formed above a surface of the graphene. The AZO film may include an Al2O3 layer and a ZnO layer.

According to still another aspect of an exemplary embodiment, there is provided an organic light emitting device which may include: a first electrode including the above graphene-based thin-film laminate; a hole injection layer formed above the first electrode; a hole transport layer formed above the hole injection layer; an emission layer formed above the hole transport layer; an electron transport layer formed above the emission layer; an electron injection layer formed above the electron transport layer; and a second electrode.

According to yet another aspect of an exemplary embodiment, there is provided a transistor which may include: a gate layer; a substrate and an insulating layer formed above the gate layer; a source electrode and a drain electrode formed above the insulating layer; and the above graphene-based thin-film laminate contacting the source electrode and the drain electrode and disposed therebetween.

BRIEF DESCRIPTION OF THE DRAWINGS

These and/or other aspects will become apparent and more readily appreciated from the following description of the exemplary embodiments, taken in conjunction with the accompanying drawings, in which.

DETAILED DESCRIPTION

Reference will now be made in detail to exemplary embodiments which are illustrated in the accompanying drawings, wherein like reference numerals refer to like elements throughout. In this regard, the presented embodiments may have different forms and should not be construed as being limited to the descriptions set forth herein. Accordingly, the embodiments are merely described below, by referring to the drawings, to explain various aspects of the inventive concept. As used herein, the term "and/or" includes any and all combinations of one or more of the associated listed items. Expressions such as "at least one of," when preceding a list of elements, modify the entire list of elements and do not modify the individual elements of the list.

Hereinafter, methods of preparing a graphene-based thin-film laminate according to exemplary embodiments and graphene-based thin-film laminates prepared using the same will be described in more detail with reference to the accompanying drawings. These embodiments are for illustrative purposes only and are not intended to limit the scope of the inventive concept, and the inventive concept should be defined by the spirit and scope of the appended claims. In addition, in the present specification and drawings, elements having substantially the same configuration denote like reference numerals, and thus, a detailed description of like elements will be provided once.

It will be understood that unless otherwise stated herein, the terms "comprises" and/or "comprising", or "includes" and/or "including" do not preclude other elements, but further include other elements.

It will be understood that when an element is referred to as being "on" another element, it can be directly on the other element or intervening elements may also be present.

The term "graphene" as used herein refers to a polycyclic aromatic carbon compound formed of a plurality of carbon atoms covalently bonded to each other (usually, bonded via a $sp^2$ bond) on one plane or multiple layers thereof stacked upon one another. The covalently bonded carbon atoms may form a 6-membered ring as a repeating unit, or the repeating unit may further include a 3-membered ring, a 4-membered ring, a 5-membered ring, and/or a 7- or more-membered ring or more.

The term "graphene" as used herein includes monocrystalline, polycrystalline and amorphous graphene, and means pristine graphene with no functional group on a surface thereof.

The term "defects" as used herein means defects according to physical damage, for example, point defects, cracks, fold, wrinkles, or the like.

According to an exemplary embodiment, a graphene-based thin-film laminate is prepared by repeating the following cycle of operations N times, which may include: (a) contacting a surface of graphene transferred onto a substrate at room temperature with a non-metal precursor gas and activating the surface of graphene with plasma at the same time; (b) performing a first purging on the resulting surface of graphene using an inert gas; (c) contacting the first-purged surface of graphene with a metal precursor gas; and (d) performing a second purging on the resulting surface of graphene using an inert gas, wherein the N times are 60 times or less.

In general, to reduce defects on a surface of graphene, for example, doping such as adsorption of a material onto the surface of graphene has been attempted. However, when such method is used, a sheet resistance of 200 Ω/sq is required to substitute for a transparent conductive film formed of indium tin oxide (ITO) or the like, but this method does not meet the requirement. In addition, the sheet resistance is not an intrinsic defect and is largely affected by defects occurring in a transferring process after synthesis of graphene.

Therefore, to reduce the defects, the exemplary embodiments provide a method of enhancing the conductivity of graphene using a highly conductive inorganic material and adjusting the number of cycles when preparing a graphene-based thin-film laminate.

In particular, the method of preparing a graphene-based thin-film laminate according to an exemplary embodiment includes repeating a cycle N times, the cycle including operation (a) to (d) described above, where the N times are 60 times or less. When the cycle is repeated 60 times or less, a sheet resistance and charge mobility (particularly, electron mobility) may be significantly enhanced.

Figure 1:
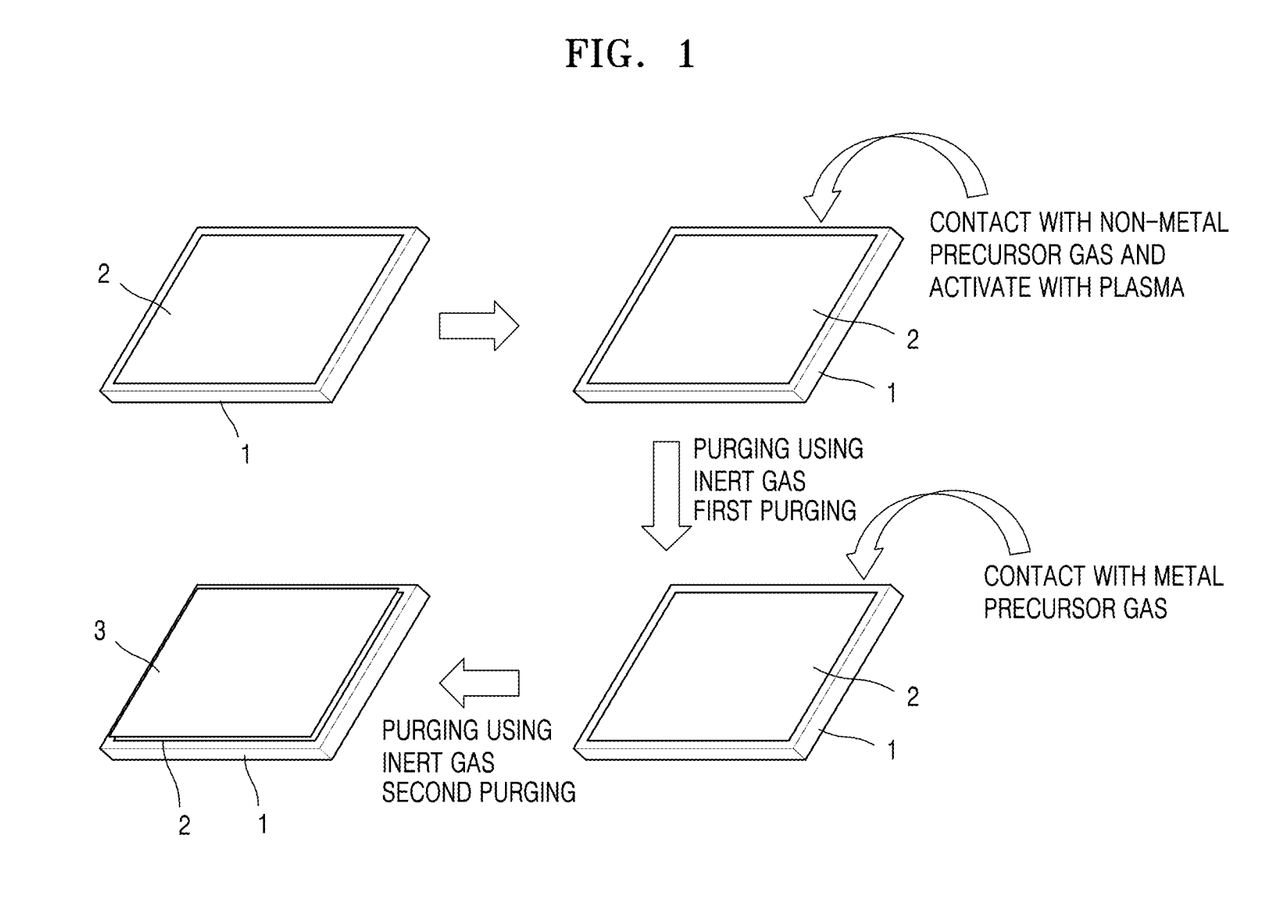
FIG. 1 is a view sequentially illustrating a method of preparing a graphene-based thin-film laminate, according to an exemplary embodiment.

FIG. 1 is a view sequentially illustrating a method of preparing a graphene-based thin-film laminate, according to an exemplary embodiment.

As illustrated in FIG. 1, the cycle includes: (a) contacting a surface of graphene 2 transferred onto a substrate 1 at room temperature with a non-metal precursor gas and activating the surface of graphene 2 with plasma at the same time; (b) performing a first purging on the resulting surface of graphene 2 using an inert gas; (c) contacting the first-purged surface of graphene 2 with a metal precursor gas; and (d) performing a second purging on the resulting surface of graphene 2 using an inert gas.

In above operation (a), that is, contacting of the surface of graphene 2 transferred onto a substrate 1 at room temperature with a non-metal precursor gas and activating the surface of graphene 2 with plasma at the same time, first, the graphene 2 transferred onto the substrate 1 at room temperature is prepared.

As an example of methods of preparing a graphene-based thin-film laminate, atomic layer deposition (ALD) involves important adhesion problems due to hydrophobicity of a graphene basal plane. To address these problems, generally, a method of increasing reactivity of a surface of graphene by heating a substrate mounted on a hot plate before the ALD process has been adopted. However, this method requires characteristics enabling a stable reaction with respect to a substrate even at high temperatures and thus there are limitations on use of a substrate. In addition, when this method is used, damage to a surface of grown graphene largely occurs.

In the method according to the present exemplary embodiment, the surface of graphene 2 transferred onto the substrate 1 comes in contact with a non-metal precursor gas while being activated with plasma and thus the substrate heating process is not required.

The substrate 1 may include, for example, at least one material selected from a polymer-based material, a silica-based material, and a metal oxide-based material. For example, the polymer-based material may be polyethylene terephthalate (PET), polyimide (PI), polyacrylonitrile (PAN), or the like. For example, the silica-based material may be $SiO_2$, glass, quartz, or the like. For example, the metal oxide-based material may be $Al_2O_3$, sapphire, $TiO_2$, ZnO, $ZrO_2$, $HfO_2$, MgO, NiO, $Co_2O$, CuO, FeO, or the like. The substrate 1 may have a thickness of, for example, about 10 nm to about 100 μm.

The transferring method is as follows. For example, a polymethylmethacrylate (PMMA) layer may be formed using PMMA on a graphene layer/substrate laminate by using a known coating method such as spin coating. The substrate may be immersed in an acidic solution, e.g., 0.1 M ammonium persulfate (($NH_4$)$_2S_2O_8$) so as to be etched and then the PMMA layer/graphene layer laminate may be transferred onto the substrate 1 after washing with water. The PMMA layer may be subjected to acetone and vacuum annealing.

As another transferring method, for example, an adhesive film may be attached to a graphene layer/substrate laminate. The adhesive film may be, for example, an acrylate-based adhesive film. The substrate may be immersed in an acidic solution, e.g., a predetermined amount of a mixed solution of sulfuric acid and peroxide ($H_2SO_4$, $H_2O_2$) so as to be etched. Subsequently, the adhesive film/graphene layer laminate is washed with a predetermined amount of water and then attached to a substrate, and the adhesive film is removed from the substrate after heating at a temperature ranging from about 100° C. to about 200° C., thereby completing the transferring of graphene onto the substrate 1.

The graphene transferred in above operation (a) may be graphene formed by chemical vapor deposition (CVD). The transverse and longitudinal lengths of the graphene transferred in above operation (a) may be, for example, about 1 mm or greater, for example, about 10 mm or greater, for example, from about 10 mm to about 1,000 mm so that large-size graphene is obtained. Large-size graphene may be obtained by freely adjusting the size of a substrate onto which graphene is not transferred. In addition, a carbon source is supplied in a gaseous form and thus the shape of the substrate is not limited. The transferred graphene may be a layer of graphene to 10 layers of graphene. For example, the transferred graphene may be formed as a monolayer. Even when the transferred graphene is a monolayer, sufficient sheet resistances and charge mobility enhancement effects may be obtained and thus this is economical.

The graphene formed by CVD is transferred onto a target substrate, and the surface thereof comes in contact with a non-metal precursor gas and at the same time, the graphene is surface-modified with plasma, e.g., $O_2$ plasma at a low temperature, e.g., 100° C. or less so as to be activated. The plasma activation may be, for example, $O_2$ plasma ashing. The surface modification by low-temperature $O_2$ plasma ionizes (e.g., OH$^-$ or the like) the non-metal precursor gas so as to be densely bonded to a bonding area of the surface of graphene. Accordingly, defects of large-size graphene formed by CVD may be further reduced.

The non-metal precursor gas may be oxygen ($O_2$), ozone ($O_3$), water ($H_2O$), or a mixture thereof. For example, the non-metal precursor gas may include $O_2$. The non-metal precursor gas may be very stably bonded to an unsaturated bond and/or a saturated bond, existing in the bonding area of the surface of graphene. The number of contacts between the surface of graphene 2 transferred onto the substrate 1 and the non-metal precursor gas may be, for example, three times or more.

In above operations (b) and (d), that is, the first and second purging operations, the inert gas is not particularly limited so long as it is an inert element gas such as $N_2$ and may be supplied at a flow rate of about 1 sccm to about 1000 sccm for about 1 second to about 100 seconds. The inert gas may be continuously supplied to and discharged from an ALD chamber.

In above operation (c), that is, contacting the purged surface of graphene 2 with a metal precursor gas, the metal precursor gas may be an aluminum precursor gas or a zinc precursor gas.

The aluminum precursor gas may be an aluminum halide, an organoaluminum compound, or a combination thereof. The aluminum precursor gas may be, for example, $AlCl_3$, $AlBr_3$, $Al(CH_3)_3$, or the like, for example, $Al(CH_3)_3$.

The zinc precursor gas may be an organozinc compound. The organozinc compound may include diethyl zinc.

The metal precursor gas forms an Al-doped ZnO (AZO) thin film 3, which is first deposited at defects on the surface of graphene to form a parallel connection. Here, the sheet resistance of the graphene may be reduced and electrical conductivity thereof may be enhanced.

A ratio of N times when the metal precursor gas is an aluminum precursor gas to N times when the metal precursor gas is a zinc precursor gas may be 1:13 to 1:49. The ratio of N times may reduce the average sheet resistance of the graphene-based thin-film laminate including the AZO thin film to 250 Ω/sq or less, for example, 200 Ω/sq or less, for example, 150 Ω/sq or less. The average sheet resistance within the ranges described above approximates to a level that enables substitution for a transparent conductive film formed of ITO or the like.

In above operations (a) and (c), when contacting the surface of graphene or the purged surface of graphene with the non-metal precursor gas or the metal precursor gas, the surface of graphene may have a temperature ranging from about 80° C. to about 100° C.

In above operations (a) to (d), the substrate may be maintained at a temperature of 100° C. or less.

Since the substrate and the surface of graphene are maintained at a temperature of 100° C. or less through the processes described above, the graphene-based thin-film laminate may have an average sheet resistance of 250 Ω/sq or less, for example, 200 Ω/sq or less, for example, 150 Ω/sq or less without damage to the surface of graphene except for the defects thereon, which results in enhanced charge mobility.

A graphene-based thin-film laminate according to another exemplary embodiment may be prepared using the method described above.

Figure 2:
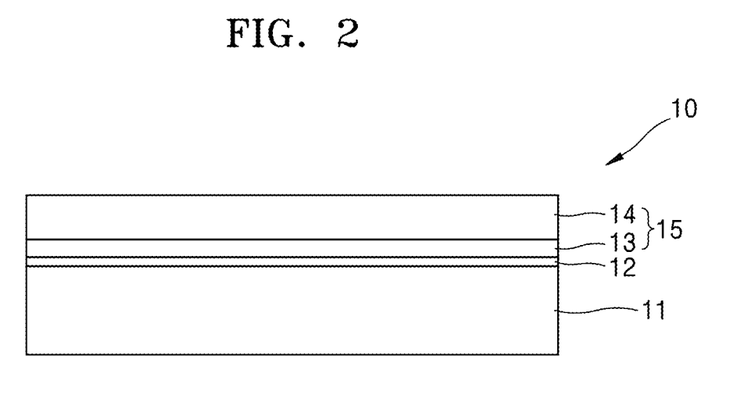
FIG. 2 is a schematic view of a graphene-based thin-film laminate prepared using the method illustrated in FIG. 1.

FIG. 2 is a schematic view of a graphene-based thin-film laminate 10 prepared using the method illustrated in FIG. 1.

Referring to FIG. 2, the graphene-based thin-film laminate 10 includes an AZO thin film 15 including an $Al_2O_3$ layer 13 and a ZnO layer 14 that are sequentially stacked on a surface of graphene 12 on a substrate 11.

The stacked $Al_2O_3$ and ZnO layers 13 and 14 may have an average thickness of 10 nm or less. For example, the average thickness of the stacked $Al_2O_3$ and ZnO layers 13 and 14 may range from about 0.5 nm to about 10 nm.

The term "average thickness" as used herein means an average of all distances between an upper surface of the AZO thin film 15 and the surface of graphene 12, i.e., a contact point between the graphene 12 and the AZO thin film 15. The average thickness may be measured using an elipsometer or a field ion microscope, or by depth profiling using X-ray photoelectron spectroscopy (XPS). However, the average thickness measurement method is not limited to the above examples and any average thickness measurement method used in the art may be used.

When the average thickness of the stacked $Al_2O_3$ and ZnO layers 13 and 14 is 10 nm or less, (average) sheet resistance of the graphene-based thin-film laminate including the stacked layers may be significantly reduced and charge mobility thereof may be significantly enhanced.

The graphene-based thin-film laminate may have an average sheet resistance of 250 Ω/sq or less. For example, the average sheet resistance of the graphene-based thin-film laminate may be 200 Ω/sq or less. For example, the average sheet resistance of the graphene-based thin-film laminate may be 150 Ω/sq or less. For example, the average sheet resistance of the graphene-based thin-film laminate may be 100 Ω/sq or less.

The amount of aluminum in the graphene-based thin-film laminate may range from about 0.7 atomic % to about 2.8 atomic % based on 100 atomic % of total metals existing in the thin film.

In the graphene-based thin-film laminate, the AZO thin film is formed on the transferred graphene with defects so that the defects are reduced to about 95% or more based on the entire area of the graphene and accordingly, sufficient reduced (average) sheet resistance and sufficient enhanced charge mobility enhancement effects may be obtained.

An electrode according to an exemplary embodiment may include the graphene-based thin-film laminate described above.

Figure 6:
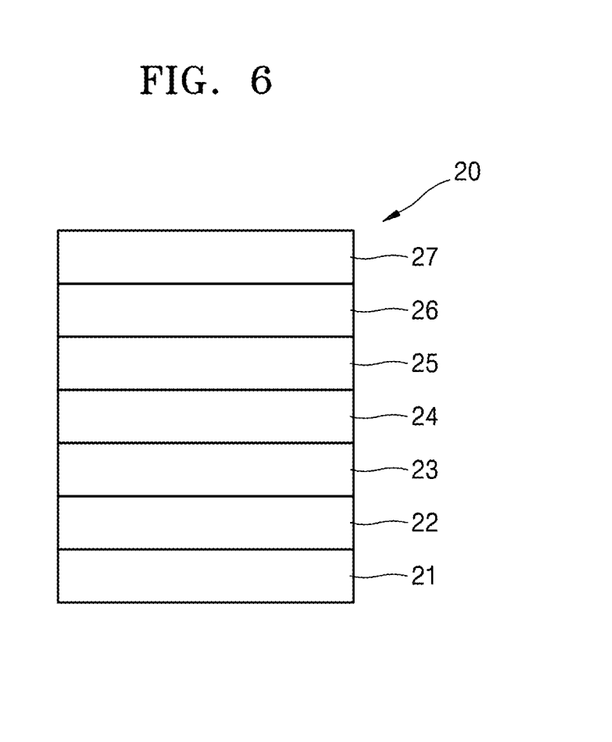
FIG. 6 is a schematic view of an organic light emitting device according to an embodiment.

FIG. 6 is a schematic view of an organic light emitting device 20 according to an exemplary embodiment.

As illustrated in FIG. 6, the organic light emitting device 20 includes a substrate (not shown), a first electrode 21, a hole injection layer (HIL) 22, a hole transport layer (HTL) 23, an emission layer (EML) 24, an electron transport layer (ETL) 25, an electron injection layer (EIL) 26, and a second electrode 27.

The first electrode 21 may be an anode or a cathode. For example, the first electrode 21 may be an anode. The substrate may be any substrate that is used in general organic light emitting devices, such as a glass substrate or a transparent plastic substrate with excellent mechanical strength, thermal stability, transparency, surface smoothness, ease of handling, and water proofness. The first electrode 21 may be formed of materials which may include at least one of indium tin oxide (ITO), indium zinc oxide (IZO), tin oxide ($SnO_2$), zinc oxide (ZnO), aluminum (Al), silver (Ag), magnesium (Mg), and the like, all of which have a high conductivity. The first electrode 21 may be formed as a transparent electrode or a reflective electrode.

The first electrode 21 may be a transparent electrode including the graphene-based thin-film laminate described above. The transparent electrode exhibits less reduction in light transmittance as compared to a transparent electrode only including graphene and thus may be very close to the light transmittance of the transparent electrode only including graphene.

Next, the HIL 22 may be formed on the first electrode 21 using a known method such as vacuum deposition, spin coating, casting, Langmuir-Blodgett (LB) deposition, or the like.

When the HIL 22 is formed by vacuum deposition, the deposition conditions may vary according to a compound used as a material for forming the HIL 22 and the desired structure and thermal properties of the HIL 22 to be formed. Generally, the deposition conditions may include a deposition temperature ranging from about 100° C. to about 500° C., a vacuum pressure ranging from about $10^{-8}$ torr to about $10^{-3}$ torr, and at a deposition rate ranging from about 0.01 Å/sec to about 100 Å/sec.

When the HIL 22 is formed by spin coating, coating conditions may vary according to the compound used to form the HIL 22, and the desired structure and thermal properties of the HIL 22 to be formed. In general, however, the coating speed may be from about 2000 rpm to about 5000 rpm, and a temperature for heat treatment, which is performed to remove a solvent after coating, may be from about 80° C. to about 200° C.

Non-limiting examples of the material for forming the HIL 22 include phthalocyanine compounds such as copper phthalocyanine, 4,4',4"-tris[(3-methylphenyl)phenylamino]triphenylamine (m-MTDATA), N,N'-di(1-naphthyl)-N,N'-diphenylbenzidine (NPB), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), and (polyaniline)/poly(4-styrenesulfonate) (PANI/PSS).

m-MTDATA

TDATA

2T-NATA

The thickness of the HIL 22 may range from about 100 Å to about 10000 Å, for example, from about 100 Å to about 1000 Å. When the thickness of the HIL 22 is within the above range, the HIL 22 may have excellent hole injection properties without a substantial increase in driving voltage.

Next, the HTL 23 may be formed on the HIL 22 using a known method such as vacuum deposition, spin coating, casting, LB deposition, or the like. When the HTL 23 is formed using vacuum deposition or spin coating, the conditions for deposition and coating are generally similar to those for the formation of the HIL 22, although the conditions for the deposition and coating may vary according to the compound used to form the HTL 23.

Non-limiting examples of suitable materials for forming the HTL 23 include carbazole derivatives such as N-phenylcarbazol and polyvinylcarbazole, and amine derivatives having aromatic condensed cycles such as NPB and N,N'-bis(3-methylphenyl)-N,N'-diphenyl-[1,1-biphenyl]-4,4'-diamine (TPD).

TPD

NPB

The thickness of the HTL 23 may range from about 50 Å to about 1000 Å, for example, from about 100 Å to about 600 Å. When the thickness of the HTL 23 is within the above range, the HTL 23 may have excellent hole transport properties without a substantial increase in driving voltage.

Next, the EML 24 may be formed on the HTL 23 using a known method such as vacuum deposition, spin coating, casting, LB deposition, or the like. When the EML 24 is formed using vacuum deposition or spin coating, the deposition or coating conditions are generally similar to those for the formation of the HIL 22, although the deposition or coating conditions may vary according to a compound used to form the EML 24.

The EML 24 may be formed using, for example, host and dopant materials known in the art. The dopant may be either a fluorescent or phosphorescent dopant material known in the art.

Non-limiting examples of known host materials include $Alq_3$, CPB (4,4'-N,N'-dicarbazole-biphenyl), PVK (poly(n-vinylcarbozole), 9,10-di(naphthalene-2-yl)anthracene (ADN), TPBI (1,3,5-tris(N-phenylbenzimidazole-2-yl)benzene), TBADN (3-tert-butyl-9,10-di(naphthyl-2-yl)anthracene, E3, and DSA (distyrylarylene).

TPBI

TBADN

E3

PVK

Non-limiting examples of known red dopant materials include PtOEP, Ir(piq)$_3$, Btp$_2$Ir(acac), and 4-(dicyanomethylene-2-t-butyl-6-(1,1,7,7-tetramethyljulolidyl-9-enyl)-4H-pyran (DCJTB).

Non-limiting examples of known green dopant materials include Ir(ppy)$_3$ (ppy=phenylpyridine), Ir(ppy)$_2$(acac), Ir(mpyp)$_3$, and C545T.

PtOEP

Ir(piq)$_3$          Btp$_2$Ir(acac)

Ir(ppy)$_3$

Ir(ppy)$_2$(acac)          Ir(mpyp)$_3$

C545T

Non-limiting examples of known blue dopant materials include F$_2$Irpic, (F$_2$ppy)$_2$Ir(tmd), Ir(dfppz)$_3$, ter-fluorene, 4,4'-bis(4-diphenylaminostyryl)biphenyl (DPAVBi), and 2,5,8,11-tetra-tert-butylperylene (TBP).

F$_2$Irpic          (F$_2$ppy)$_2$Ir(tmd)          Ir(dfppz)$_3$

DPAVBi

TBP

The content of the dopant may range from about 0.1 parts by weight to about 20 parts by weight, for example, from about 0.5 parts by weight to about 12 parts by weight based on 100 parts by weight of the EML-forming material, i.e., 100 parts by weight of the host and the dopant. When the content of the dopant is within the above range, concentration quenching may be substantially prevented.

The thickness of the EML 24 may range from about 100 Å to about 1000 Å, for example, from about 200 Å to about 600 Å. When the thickness of the EML 24 is within the above range, the EML 24 may have excellent light-emitting properties without a substantial increase in driving voltage.

If the EML 24 includes a phosphorescent dopant, a hole blocking layer (HBL, not shown) may be formed on the EML 24 to prevent triplet excitons or holes from diffusing to the ETL 25. Materials used for the HBL are not particularly limited and may be selected from HBL materials known in the art. Non-limiting examples of suitable HBL materials include oxadiazole derivatives, triazole derivatives, phenanthroline derivatives, Balq, and BCP.

The thickness of the HBL may range from about 50 Å to 1000 Å, for example, from about 100 Å to about 300 Å. When the thickness of the HBL is within the above range, diffusion of triplet excitons or holes to the ETL 25 may be prevented without a substantial increase in driving voltage.

Next, the ETL 25 may be formed, for example, by vacuum deposition, spin coating, casting, or the like. When the ETL 25 is formed by vacuum deposition or spin coating, the deposition or coating conditions may vary according to compounds used. Generally, the process conditions for forming the ETL 25 may be similar to those for forming the HIL 22.

Materials used for the ETL 25 may be any ETL-forming materials known in the art, for example, quinoline derivatives, tris(8-quinolinolate)aluminum ($Alq_3$), TAZ, Balq, and the like.

The thickness of the ETL 25 may range from about 100 Å to 1000 Å, for example, from about 100 Å to about 500 Å. When the thickness of the ETL 25 is within the above range, the ETL 25 may have excellent electron transport properties without a substantial increase in driving voltage.

In addition, the EIL 26 which has a function of facilitating the injection of electrons from the cathode may be formed on the ETL 25.

Materials used for the EIL 26 include any EIL-forming materials known in the art, for example, LiF, NaCl, CsF, $Li_2O$, and BaO. The deposition or coating conditions may vary according to the compounds used, but generally may be similar to those used to form the HIL 22.

The thickness of the EIL 26 may range from about 1 Å to 100 Å, for example, from about 5 Å to about 90 Å. When the thickness of the EIL 26 is within the above range, the EIL 26 may have excellent electron injection properties without a substantial increase in driving voltage.

Finally, the second electrode 27 may be formed on the EIL 26 by vacuum deposition or sputtering. The second electrode 27 may be used as a cathode or an anode. Materials for forming the second electrode 27 may include a metal, an alloy, an electrically conductive compound, and mixtures thereof, all of which have a low work function. Non-limiting examples of such materials include lithium (Li), magnesium (Mg), aluminum (Al), Al—Li, calcium (Ca), Mg-indium (In), and Mg-silver (Ag). In addition, the second electrode 27 may be formed of a transparent material such as ITO or IZO to provide a top-emission type organic light emitting device.

The organic light-emitting device 20 may be used in various forms of flat-panel display devices, such as passive matrix organic light emitting display devices or active matrix organic light emitting display devices. For example, when the organic light-emitting device 20 is used in an active matrix organic light emitting display device including a thin-film transistor, the first electrode 21 on the substrate is a pixel electrode, which is electrically connected to a source electrode or a drain electrode of the thin-film transistor. The organic light-emitting device 20 may also be included in a flat panel display device having a double-sided screen.

In addition, when the organic light-emitting device 20 includes a plurality of organic layers, at least one of the organic layers may be formed by deposition or using a wet process, e.g., coating with a compound prepared in a solution form.

An electronic device according to an exemplary embodiment may include the graphene-based thin-film laminate described above. The electronic device may be, for example, a field effect transistor (FET), but types or kinds thereof are not particularly limited and may be appropriately selected according to the application of the electronic device. The FET may be, for example, a gack-gated FET.

Figure 7:
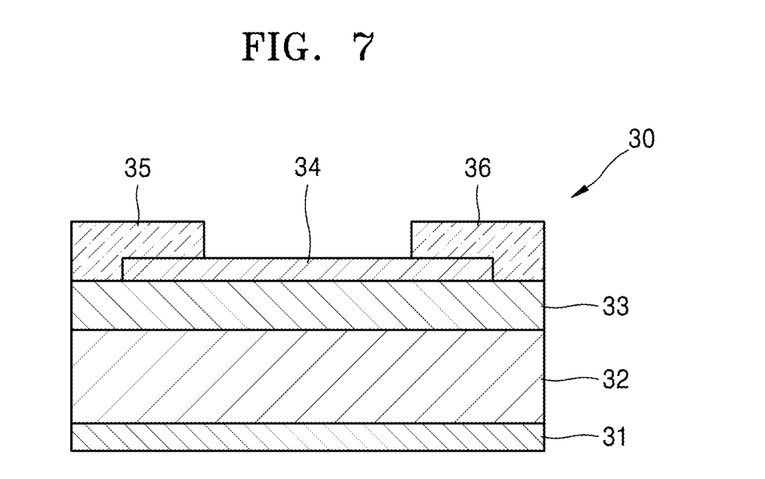
FIG. 7 is a schematic view of a back-gated field effect transistor according to an embodiment.

FIG. 7 is a schematic view of a back-gated FET 30 according to an exemplary embodiment.

As illustrated in FIG. 7, the back-gated FET 30 includes a Si-doped substrate 32 as a back gate and an insulating layer 33 that are sequentially stacked on a back gate contact surface 31. A graphene-based thin-film laminate channel layer 34 contacts with a source electrode 35 and a drain electrode 36 therebetween.

In this regard, an interval between the source electrode 35 and the drain electrode 36 may be determined according to the use of the FET used. For example, the interval between the source electrode 35 and the drain electrode 36 may range from about 0.1 μm to about 1 mm, for example, from about 1 μm to about 100 μm, for example, from about 5 μm to about 100 μm.

The source and drain electrodes 35 and 36 may be formed of any conductive material. Non-limiting examples of the conductive material include platinum, gold, silver, nickel, chromium, copper, iron, tin, antimonial lead, tantalum, indium, palladium, tellurium, rhenium, iridium, aluminum, ruthenium, germanium, molybdenum, tungsten, tin-antimony oxide, indium-tin oxide (ITO), fluorine-doped zinc oxide, zinc, carbon, graphite, glassy carbon, silver paste, carbon paste, lithium, beryllium, sodium, magnesium, potassium, calcium, scandium, titanium, manganese, zirconium, gallium, niobium, a sodium-potassium alloy, a magnesium/copper mixture, a magnesium/silver mixture, a magnesium/aluminum mixture, a magnesium/indium mixture, an aluminum/aluminum oxide mixture, and a lithium/aluminum mixture. When these materials are used, an electrode may be formed by sputtering or vacuum deposition.

The source electrode 35 and the drain electrode 36 may be formed of a fluidic electrode material such as a solution, paste, ink or dispersion including the conductive material described above. For example, a well-known conductive paste may be used as a dispersion including metal fine particles, and any dispersion including metal fine particles each having a particle diameter ranging from about 0.5 nm to about 50 nm, for example, from about 1 nm to about 10 nm, may be used. Non-limiting examples of the metal fine particles include particles of platinum, gold, silver, nickel, chromium, copper, iron, tin, antimonial lead, tantalum, indium, palladium, tellurium, rhenium, iridium, aluminum, ruthenium, germanium, molybdenum, tungsten, and zinc.

The graphene-based thin-film laminate channel layer 34 may have a width and a length that range from about 20 nm to about 20 μm. The width and length of the graphene-based thin-film laminate channel layer 34 are not limited to the above range and may be appropriately adjusted according to an application to be used.

The insulating layer 33 may be formed of any material having electrical insulating properties and capable of being formed as a thin film. For example, a material having an electrical resistivity of 10 Ωcm or greater at room temperature, such as a metal oxide (e.g., silicon oxide), a metal nitride (e.g., silicon nitride), a polymer, or an organic low molecule may be used. For example, an inorganic oxide film having high specific inductive capacity may be used as the insulating layer 33.

Non-limiting examples of the inorganic oxide include silicon oxide, aluminum oxide, and hafnium oxide. The inorganic oxide film used as the insulating layer 33 may have a thickness ranging from about 100 nm to about 300 nm. In addition, examples of the inorganic oxide include silicon nitride and aluminum nitride.

The insulating layer 33 may be formed of an organic compound such as polyimide, polyamide, polyester, polyacrylate, photo-curable resins such as photo-radical polymerization systems and photo-cation polymerization systems, copolymers containing an acrylonitrile component, polyvinylphenol, polyvinylalcohol, novolak resins, or cyanoethylflurane.

In addition, polymeric materials having a high dielectric constant, such as wax, polyethylene, polychloropyrene, polyethylene terephthalate, polyoxymethylene, polyvinyl chloride, poly(vinylidene fluoride), polymethylmethacrylate, polysulfone, polycarbonate (PC), polyimidecyanoethyl flurane, poly(vinylphenol) (PVP), poly(methylmethacrylate) (PMMA), polycarbonate (PC), polystyrene (PS), polyolefin, polyacrylamide, poly(acrylic acid), novolak resin, resol resin, polyimide, polyxylylene, epoxy resin, and flurane may be used.

The insulating layer 33 may be a layer in which a plurality of the above-described inorganic or organic compound materials are mixed or may have a stacked layer structure thereof. According to an exemplary embodiment, the device performance may be controlled by mixing or stacking a material having a high dielectric constant and a material having water repellency.

Methods of forming the insulating layer 33 include dry processes such as vacuum vapor deposition, molecular beam epitaxy, an ion cluster beam technique, low-energy ion beam technology, ion plating, a chemical vapor deposition (CVD) method, sputtering, and atmospheric pressure plasma, and wet processes, for example, application methods such as spray coating, spin coating, blade coating, dip coating, casting, roll coating, bar-coating and die coating, and patterning methods such as printing and an inkjet process. These methods may be used depending upon the kind of the material used. As the wet process, a method of applying and drying a liquid in which inorganic oxide fine particles are dispersed in any organic solvent or water, if necessary, by using a dispersing agent such as a surfactant, or a so-called sol-gel process wherein a solution of an oxide precursor such as an alkoxide form is applied and dried may be used.

The Si-doped substrate 32 as a back gate has enhanced conductivity and thus may reduce a contact resistance with the source and drain electrodes 35 and 36.

In addition, the graphene-based thin-film laminate described above may be used in touch sensors, semiconductor electrodes or devices, electromagnetic wave-shielding devices and as an encapsulate, in addition to the FET described above.

Additional exemplary embodiments will now be described in further detail with reference to the following examples and comparative examples. However, these examples are for illustrative purposes only and are not intended to limit the scope of the one or more embodiments.

EXAMPLES (Preparation of Graphene-Based Laminate)

Preparation Example 1: Preparation of Graphene-Based Laminate

A monolayer of graphene having a thickness of about 0.34 nm was grown on 35 μm Cu foil by using a rapid thermal CVD device and a halogen lamp heater.

An acrylate-based adhesive film was attached to the graphene layer/Cu foil laminate. The Cu foil was immersed in 100 g/L of a mixed solution of sulfuric acid and peroxide ($H_2SO_4$, $H_2O_2$) so as to be etched. Thereafter, the adhesive film/graphene layer laminate was washed with a predetermined amount of water and then attached to a $SiO_2$ substrate, followed by heating at a temperature ranging from about 100° C. to about 150° C. Subsequently, the adhesive film was removed from the substrate so that graphene was transferred onto the $SiO_2$ substrate, thereby completing the preparation of a graphene-based laminate including the SiO₂ substrate with graphene transferred thereonto.

(Preparation of Graphene-Based AZO Thin Film Laminate)

Example 1: Preparation of Graphene-Based AZO Thin Film Laminate

The graphene-based laminate prepared according to Preparation Example 1 above was mounted on a stage in an atomic layer deposition chamber (available from AP System) and an AZO thin film including an Al₂O₃ layer and a ZnO layer that were sequentially stacked was formed thereon by atomic layer deposition (ALD).

The ALD process used to form the AZO thin film was performed as follows. A cycle of operations including: (a) contacting a surface of graphene transferred with O₂ gas and activating the surface of graphene with plasma at the same time; (b) performing a first purging on the resulting surface of graphene by O₂ gas and nitrogen gas; (c) contacting the purged surface of graphene with trimethyl aluminum (TMA) gas or diethyl zinc (DEZ) gas; and (d) performing a second purging on the resulting surface of graphene by nitrogen gas was repeated 14 times.

In particular, in above operation (b), a substrate came in contact with O₂ gas ionized by plasma (power: 1,000 W) to induce a reaction therebetween while supplying O₂ gas and nitrogen gas at a flow rate of 50 sccm at 100° C. for 1 second or less, and, in above operations (c), the TMA gas was supplied for 1 second or less. In above operation (d), the second purging process was performed by supplying nitrogen gas at a flow rate of 50 sccm at 100° C. for 10 seconds. This cycle was performed once to form an Al₂O₃ layer having an average thickness of about 0.1 nm to about 0.2 nm on the surface of graphene transferred.

Thereafter, this cycle was repeated 13 times in the same manner as in the first cycle, except that in above operations (c), DEZ gas was supplied instead of the TMA gas, to form a ZnO layer having an average thickness of about 1.3 nm to about 2.6 nm on the Al₂O₃ layer, thereby completing the preparation of a graphene-based AZO thin film laminate.

Example 2: Preparation of Graphene-Based AZO Thin Film Laminate

A graphene-based AZO thin film laminate, including a ZnO layer having an average thickness of about 1.9 nm to about 3.8 nm on an Al₂O₃ layer having an average thickness of about 0.1 nm to about 0.2 nm, was prepared in the same manner as in Example 1, except that the cycle in which DEZ gas was supplied in above operation (c) was repeated 19 times instead of 13 times so that the total number of cycles was 20 cycles.

Example 3: Preparation of Graphene-Based AZO Thin Film Laminate

A graphene-based AZO thin film laminate, including a ZnO layer having an average thickness of about 4.9 nm to about 9.8 nm on an Al₂O₃ layer having an average thickness of about 0.1 nm to about 0.2 nm, was prepared in the same manner as in Example 1, except that the cycle in which DEZ gas was supplied in above operation (c) was repeated 49 times instead of 13 times so that the total number of cycles was 50 cycles.

Example 4: Preparation of Graphene-Based AZO Thin Film Laminate

A graphene-based AZO thin film laminate, including a ZnO layer having an average thickness of about 3.8 nm to about 7.6 nm on an Al₂O₃ layer having an average thickness of about 0.2 nm to about 0.4 nm, was prepared in the same manner as in Example 1, except that the cycle in which DEZ gas was supplied in above operation (c) was repeated 19 times instead of 13 times and the 19 cycles were consecutively repeated once more so that the total number of cycles was 39 cycles.

Example 5: Preparation of Graphene-Based AZO Thin Film Laminate

A graphene-based AZO thin film laminate, including a ZnO layer having an average thickness of about 5.7 nm to about 11.4 nm on an Al₂O₃ layer having an average thickness of about 0.3 nm to about 0.6 nm, was prepared in the same manner as in Example 1, except that the cycle in which DEZ gas was supplied in above operation (c) was repeated 19 times instead of 13 times and the 19 cycles were consecutively repeated twice more so that the total number of cycles was 58 cycles.

Comparative Example 1: Graphene-Based Laminate

The graphene-based laminate prepared according to Preparation Example 1 was used.

Comparative Example 2: Preparation of Graphene-Based AZO Thin Film Laminate

A graphene-based AZO thin film laminate, including a ZnO layer having an average thickness of about 5 nm to about 10 nm on an Al₂O₃ layer having an average thickness of about 0.1 nm to about 0.2 nm, was prepared in the same manner as in Example 1, except that the cycle in which DEZ gas was supplied in above operation (c) was repeated 74 times instead of 13 cycles so that the total number of cycles was 75 cycles.

Comparative Example 3: Preparation of Graphene-Based AZO Thin Film Laminate

A graphene-based AZO thin film laminate, including a ZnO layer having an average thickness of about 1.2 nm to about 2.4 nm on an Al₂O₃ layer having an average thickness of about 0.1 nm to about 0.2 nm, was prepared in the same manner as in Example 1, except that the cycle in which DEZ gas was supplied in above operation (c) was repeated 99 times instead of 13 cycles so that the total number of cycles was 100 cycles.

Analysis Example 1: Scanning Electron Microscope (SEM) Analysis

An SEM experiment was conducted on the graphene-based laminate prepared according to Comparative Example 1 and the graphene-based AZO thin film laminate prepared according to Example 1. SEM equipment (Vega 3 sbh, available from Tescan, resolution: 3.5 nm, operating at 30 kV) was used as an SEM analyzer. The results thereof are shown in FIGS. 3A and 3B, respectively.

Figure 3A:
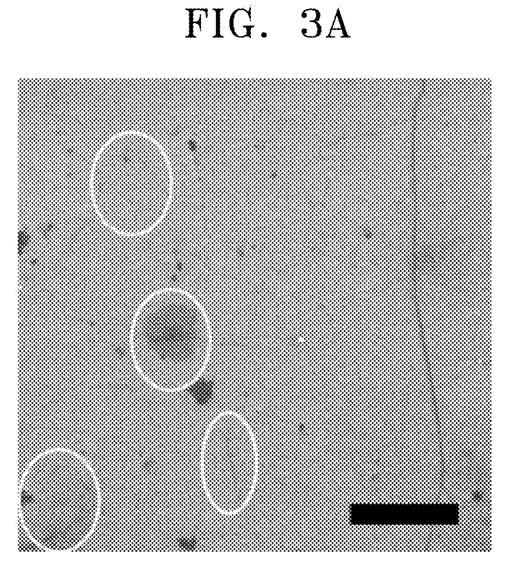
FIGS. 3A and 3B are scanning electron microscope (SEM) images of a graphene-based laminate prepared according to Comparative Example 1 and a graphene-based Al-doped ZnO (AZO) thin-film laminate prepared according to Example 1, respectively.
Figure 3B:
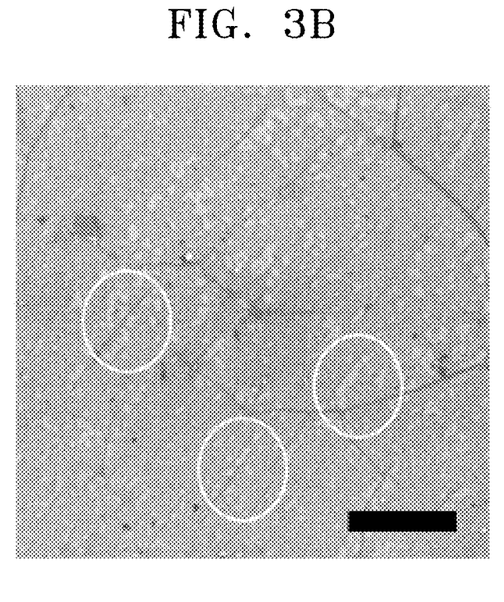

As illustrated in FIGS. 3A and 3B, defects (represented as white circles) are confirmed on a surface of the graphene-based laminate of Comparative Example 1, while it is confirmed that defects (represented as white circles) do not appear on a surface of the graphene-based AZO thin film laminate of Example 1 or are considerably reduced.

Analysis Example 2: Light Transmittance Analysis

The monolayer (thickness: about 0.34 nm) of graphene grown on 35 μm Cu foil of Preparation Example 1 was transferred onto a glass substrate having a thickness of about 0.8 μm. A graphene-based laminate with graphene transferred onto the glass substrate was denoted as Comparative Reference Example 1, and a graphene-based AZO thin film laminate where an AZO thin film was formed on a surface of graphene transferred onto the glass substrate by using the same method and device as those used in Example 1 was denoted as Reference Example 1.

The graphene-based laminate prepared according to Comparative Reference Example 1 and the graphene-based AZO thin film laminate prepared according to Reference Example 1 were irradiated with light having a wavelength ranging from about 300 nm to about 800 nm using an UV spectrophotometer (V-550, available from JASCO) and light transmittances thereof were measured. The measurement results are shown in FIG. 4.

Figure 4:
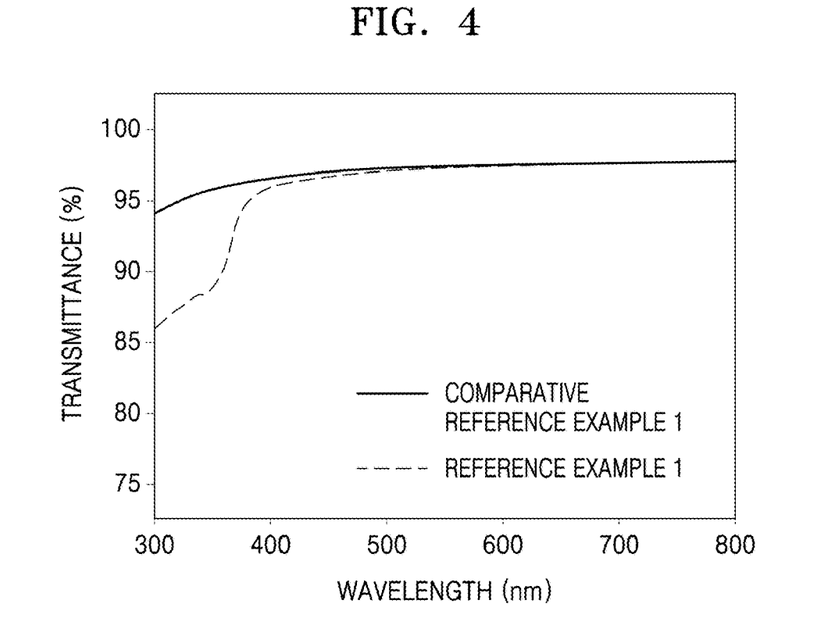
FIG. 4 is a graph showing light transmittance measurement results of a graphene-based laminate prepared according to Comparative Reference Example 1 and a graphene-based AZO thin-film laminate prepared according to Reference Example 1.

Referring to FIG. 4, the graphene-based AZO thin film laminate of Reference Example 1 exhibited, at 550 nm, a light reduction of less than about 2% and a light transmittance similar to that of the graphene-based laminate of Comparative Reference Example 1. From the result shown in FIG. 4, it is confirmed that although an AZO thin film is formed on a surface of graphene, optical properties of the graphene do not deteriorate.

Evaluation Example 1: Electrical Characteristics Evaluation (1) Electrical Characteristics Evaluation 1

Average sheet resistances of the graphene-based AZO thin film laminate of Example 2, the graphene-based laminate of Comparative Example 1, and the graphene-based AZO thin film laminates of Comparative Examples 2 and 3 were measured. The measurement results are shown in Table 1 below and FIG. 5. The average sheet resistance is an average of 30 points measured using a 4-point probe method.

TABLE 1

| | Average sheet resistance (Ω/sq) |
|---|---|
| Example 2 | 250 |
| Comparative Example 1 | 1112 |
| Comparative Example 2 | 1911 |
| Comparative Example 3 | 1420 |

Figure 5:
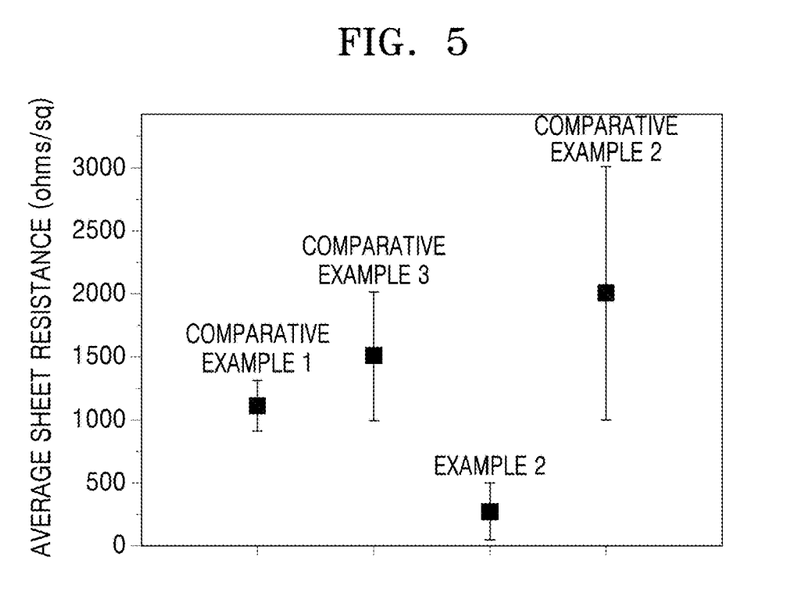
FIG. 5 is a graph showing average sheet resistance measurement results of a graphene-based AZO thin-film laminate prepared according to Example 2, the graphene-based laminate of Comparative Example 1, and graphene-based AZO thin-film laminates prepared according to Comparative Examples 2 and 3.

Referring to Table 1 above and FIG. 5, the graphene-based AZO thin film laminate of Example 2 has a lower average sheet resistance than the graphene-based laminate of Comparative Example 1 and the graphene-based AZO thin film laminates of Comparative Examples 2 and 3. In addition, the graphene-based AZO thin film laminate of Example 2 had an average sheet resistance of minimum about 200 Ω/sq and the average sheet resistance thereof decreased by minimum 40 Ω/sq. In addition, the graphene-based AZO thin film laminate of Example 2 partially had a sheet resistance of 200 Ω/sq or less.

In this regard, the amount of Al existing in the graphene-based AZO thin film laminate of Example 2 was from about 0.7 atomic % to about 2.8 atomic % and from about 97.2 atomic % to about 99.3 atomic % based on 100 atomic % of total metals (Al and Zn) existing in the AZO thin film.

(2) Electrical Characteristics Evaluation 2

Electrical characteristics of the graphene-based AZO thin film laminates of Examples 4 and 5 and the graphene-based laminate of Comparative Example 1 were evaluated using a 4200 semiconductor characterization system (available from Keithley) and a direct-current 4-probe method under room temperature and normal pressure conditions.

Figure 8:
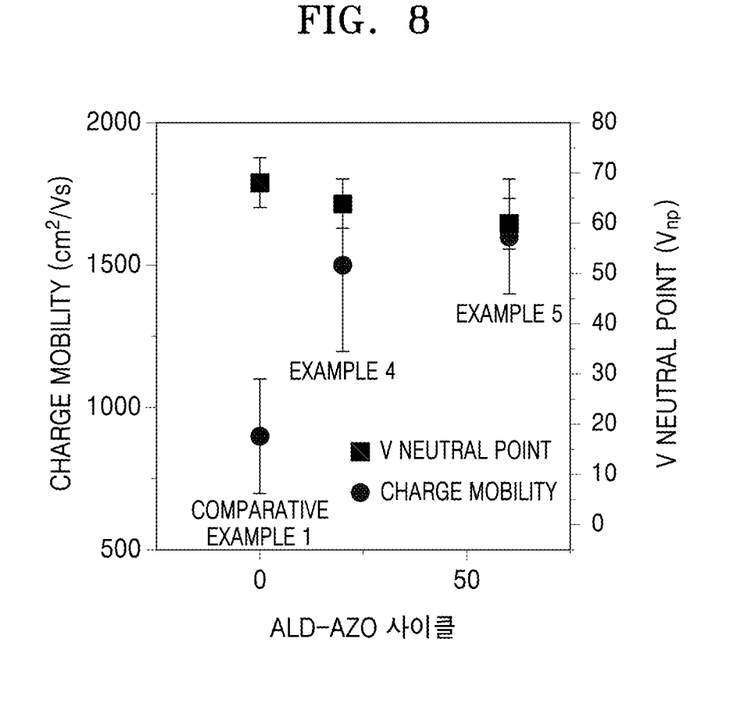
FIG. 8 is a graph showing a charge neutral point voltage $V_{NP}$ and charge mobility of each of graphene-based AZO thin-film laminates prepared according to Examples 4 and 5 and the graphene-based laminate of Comparative Example 1.

Referring to FIG. 8, the graphene-based AZO thin film laminates of Examples 4 and 5 exhibited changes in charge neutral point voltage ($V_{NP}$), e.g., from about 5 V to about 10 V and from about 7 V to about 15 V, respectively, as compared to the graphene-based laminate of Comparative Example 1. From the changes in charge $V_{NP}$, changes in carrier concentration are confirmed.

In addition, charge mobilities (particularly, electron mobilities) of the graphene-based AZO thin film laminates of Examples 4 and 5 increased by from about 50% to about 100% and from about 70% to about 100%, respectively, as compared to that of the graphene-based laminate of Comparative Example 1.

From the results described above, it is confirmed that the graphene-based AZO thin film laminates of Examples 4 and 5 exhibited reduced sheet resistance and enhanced charge mobility (particularly, electron mobility) as compared to the graphene-based laminate of Comparative Example 1.

As is apparent from the foregoing description, a method of preparing a graphene-based thin-film laminate, according to an exemplary embodiment, includes repeating a cycle of operations N times, the cycle including operations (a) to (d) described above. Here, the N times are 60 times or less, and a graphene-based thin-film laminate prepared using the method may have enhanced charge mobility (particularly, electron mobility) and reduced average sheet resistance.

It should be understood that the exemplary embodiments described herein should be considered in a descriptive sense only and not for purposes of limitation. Descriptions of features or aspects within each embodiment should typically be considered as available for other similar features or aspects in other embodiments.

While exemplary embodiments have been described with reference to the drawings, it will be understood by those of ordinary skill in the art that various changes in form and details may be made therein without departing from the spirit and scope of the inventive concept as defined by the following claims.

What is claimed is:

1. A method of preparing a graphene-based thin-film laminate, the method comprising conducting a cycle N times, the cycle comprising:
   (a) contacting a surface of graphene transferred onto a substrate at room temperature with a non-metal precursor gas and activating the surface of graphene with plasma at the same time;
   (b) performing a first purging on the non-metal precursor contacted and plasma-activated surface of the graphene using an inert gas;
   (c) contacting the first-purged surface of the graphene with a metal precursor gas, the metal precursor gas being an aluminum precursor gas or a zinc precursor gas; and (d) performing a second purging on the metal precursor gas contacted surface of the graphene using an inert gas, wherein the N times consist of at least one cycle using the aluminum precursor gas in step (c) and at least one cycle using the zinc precursor gas in step (c), and the N times are 60 times or less, and wherein a ratio of a number of cycles using the aluminum precursor gas in step (c) to a number of cycles using the zinc precursor gas in step (c) is 1:13 to 1:49.

2. The method of claim 1, wherein the N times are 14 to 60 times.

3. The method of claim 1, wherein the aluminum precursor gas comprises an aluminum halide, an organoaluminum compound, or a combination thereof.

4. The method of claim 1, wherein the zinc precursor gas is an organozinc compound.

5. The method of claim 4, wherein the organozinc compound comprises diethyl zinc.

6. The method of claim 1, wherein in steps (a) and (c), a temperature of the surface of graphene is from about 80° C. to about 100° C. when contacting with the non-metal precursor gas or the metal precursor gas, respectively.

7. The method of claim 1, wherein the substrate is maintained at a temperature of 100° C. or less throughout the cycle.

8. The method of claim 1, wherein the ratio of the number of cycles using the aluminum precursor gas in step (c) to the number of cycles using the zinc precursor gas in step (c) is 1:13 to 1:19.

* * * * *